(12) United States Patent
Pettigrew et al.

(10) Patent No.: US 6,615,029 B1
(45) Date of Patent: Sep. 2, 2003

(54) ELECTRONIC CIRCUITS

(76) Inventors: Archibald McGilvray Pettigrew, West Glen House, West Glen Road, Kilmacolm, Renfrewshire PA13 4PH (GB); Thomas James Muir, 54 P South Titirangi Rd., Titirangi, Auckland (NZ)

( * ) Notice: Subject to any disclaimer, the term of this patent is extended or adjusted under 35 U.S.C. 154(b) by 0 days.

(21) Appl. No.: 09/623,610
(22) PCT Filed: Mar. 3, 1999
(86) PCT No.: PCT/GB99/00629
§ 371 (c)(1),
(2), (4) Date: Aug. 31, 2000
(87) PCT Pub. No.: WO99/45635
PCT Pub. Date: Sep. 10, 1999

(30) Foreign Application Priority Data

Mar. 3, 1998 (GB) .............................. 9804354

(51) Int. Cl.⁷ .................................. H04B 1/10
(52) U.S. Cl. ................. 455/295; 455/296; 455/306; 375/346
(58) Field of Search ................ 455/306, 295, 455/296, 308–309, 312, 337, 205–206, 210, 260, 325; 329/318–321, 315–316, 349, 351, 353; 375/346, 350

(56) References Cited

U.S. PATENT DOCUMENTS 4,211,979 A * 7/1980 Muraoka et al. ............ 455/306
5,341,106 A 8/1994 Pettigrew ..................... 329/319
5,778,310 A * 7/1998 Tong et al. .................. 455/306

FOREIGN PATENT DOCUMENTS

JP 55008951 1/1980
WO WO 97 20397 6/1997

OTHER PUBLICATIONS

Pettigrew A: "Demodulation a New Approach"; *Electronics World And Wireless World*, vol. 101, No. 1717, Dec. 1, 1995, pp. 1026–1031, XP000548985; See p. 1030, col. 2, line 29—p. 1031, col. 3, line 6; fig. 8.

Pettogrew A M et al: "Coherent Demodulation of DSSC Without Pilot Tone Using the Amplitude–Locked Loop"; *Journal of the Audio Engineering Society*, vol. 41, No. 12, Dec.1, 1993, pp. 998–1007, XP000514962.

* cited by examiner

Primary Examiner—Lee Nguyen
(74) Attorney, Agent, or Firm—Thompson Coburn, LLP

(57) ABSTRACT

There is described a method and apparatus for separating two independently modulated co-channel interfering fm carriers.

The method involves generating a numerator signal being a function of generating a numerator function and a denominator function, the numerator and denominator functions being themselves functions of the ratio of the interfering carrier to the wanted carrier and of the instantaneous difference between the frequency of the wanted carrier and the interfering carrier, and performing a division process between said denominator function and said numerator function to generate a quotient function and using said quotient function to condition an output circuit.

17 Claims, 7 Drawing Sheets

ELECTRONIC CIRCUITS

BACKGROUND OF THE INVENTION

This invention relates to electronic circuits and more particularly to the demodulation of frequency modulated (fm) radio signals.

Whereas electronic circuits for the demodulation of fm signals have been known since the use of fm for radio broadcasting began in the nineteen thirties, there has been a major problem with all existing demodulators, namely, that if two fm transmissions reach the receiver at the same carrier frequency and amplitude, mutual destruction of both transmissions occurs and all intelligibility is lost.

This is a fundamental property of fm demodulators which use saturating circuits prior to the fm demodulator to remove amplitude noise effects from disturbing the wanted signal.

This effect is called co-channel interference especially when the second interfering transmission is a different station. There are four other types of similar interference which result in complete loss of carriers of similar strength (1–15 dB difference) and having the same or similar carrier frequency.

It is an object of the present invention to provide a method and apparatus for minimising and, in some cases, eliminating the aforementioned problems from fm demodulators.

BRIEF SUMMARY OF THE INVENTION

According to the present invention there is provided a method for the demodulation of fm signals, the fm signal, comprising a wanted carrier signal and an interfering carrier signal, the method comprising the steps of: generating a first signal, said first signal being a function of the ratio of the interfering carrier to the wanted carrier and of the instantaneous difference between the frequency of the wanted carrier and the interfering carrier; generating a second signal from said first signal by removing any dc value from said first signal; generating the mathematical square of said second signal; generating a dc value from said squared signal; generating a numerator function being a function of said dc value, said second signal and a dc offset; generating a denominator function being a function of said first signal and said dc offset; performing a division process between said numerator function and said denominator function to generate a quotient function; and using said quotient function to control a demodulator circuit to generate a desired output.

Further according to the present invention there is provided a circuit for demodulating fin signals, the fm signals comprising a wanted carrier signal and an interfering carrier signal, the circuit comprising means for generating a first signal, said first signal being a function of the ratio of the interim carrier to the wanted carrier and of the instantaneous difference between the frequency of the wanted carrier and the interfering carrier; means for generating a second signal from said first signal by removing any dc value from said first signal; a squaring circuit for generating the mathematical square of said second signal; means for generating a dc value from said squared signal means for generating a numerator function being a function of said dc value, said second signal and a dc offset; means for generating a denominator function being a function of said first signal and said dc offset; a division circuit for performing a division process between said numerator function and said denominator function to generate a quotient function; and a demodulator circuit conditioned by said quotient function to generate a desired output.

BRIEF DESCRIPTION OF THE SEVERAL VIEWS OF THE DRAWINGS

Embodiments of the present invention will now be described, by way of example, with reference to the accompanying drawings, in which.

DETAILED DESCRIPTION OF THE INVENTION

Figure 1:
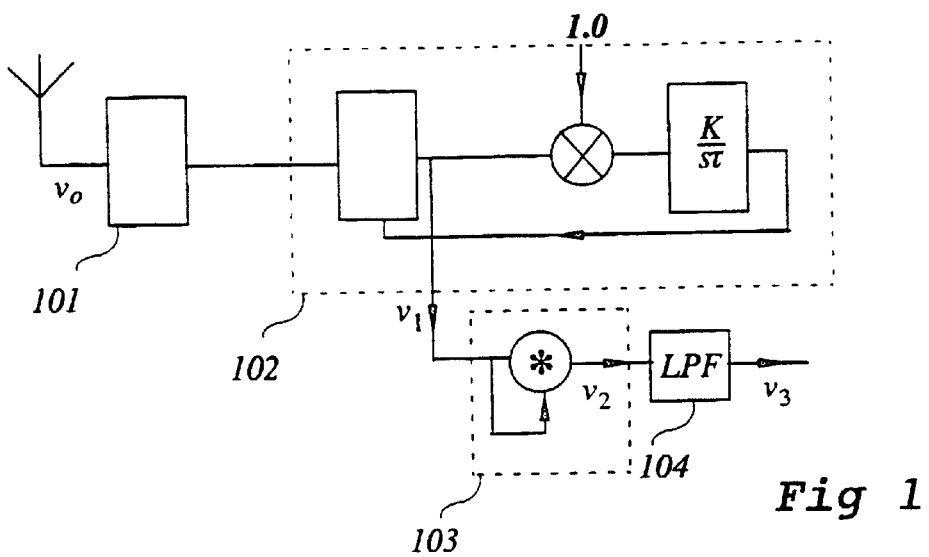
FIG. 1 is a block diagram of the initial stage of the circuit of the invention.
Figure 2:
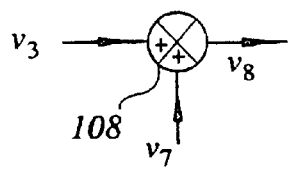
FIG. 2 is a block diagram of the denominator function generator stage.
Figure 3:
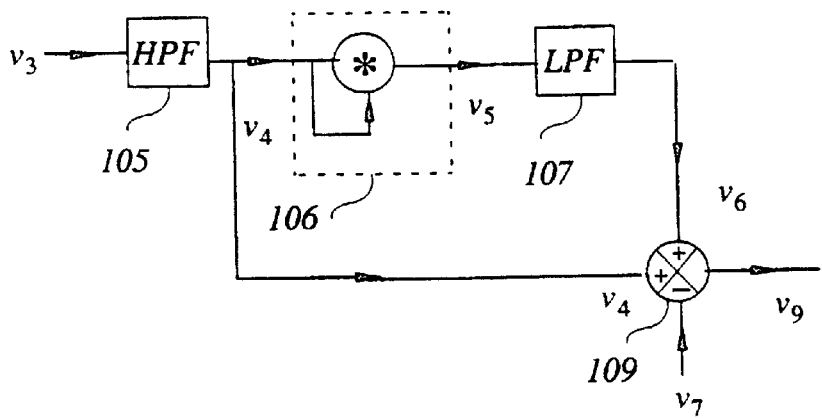
FIG. 3 is a block diagram of the numerator function generator stage.
Figure 4:
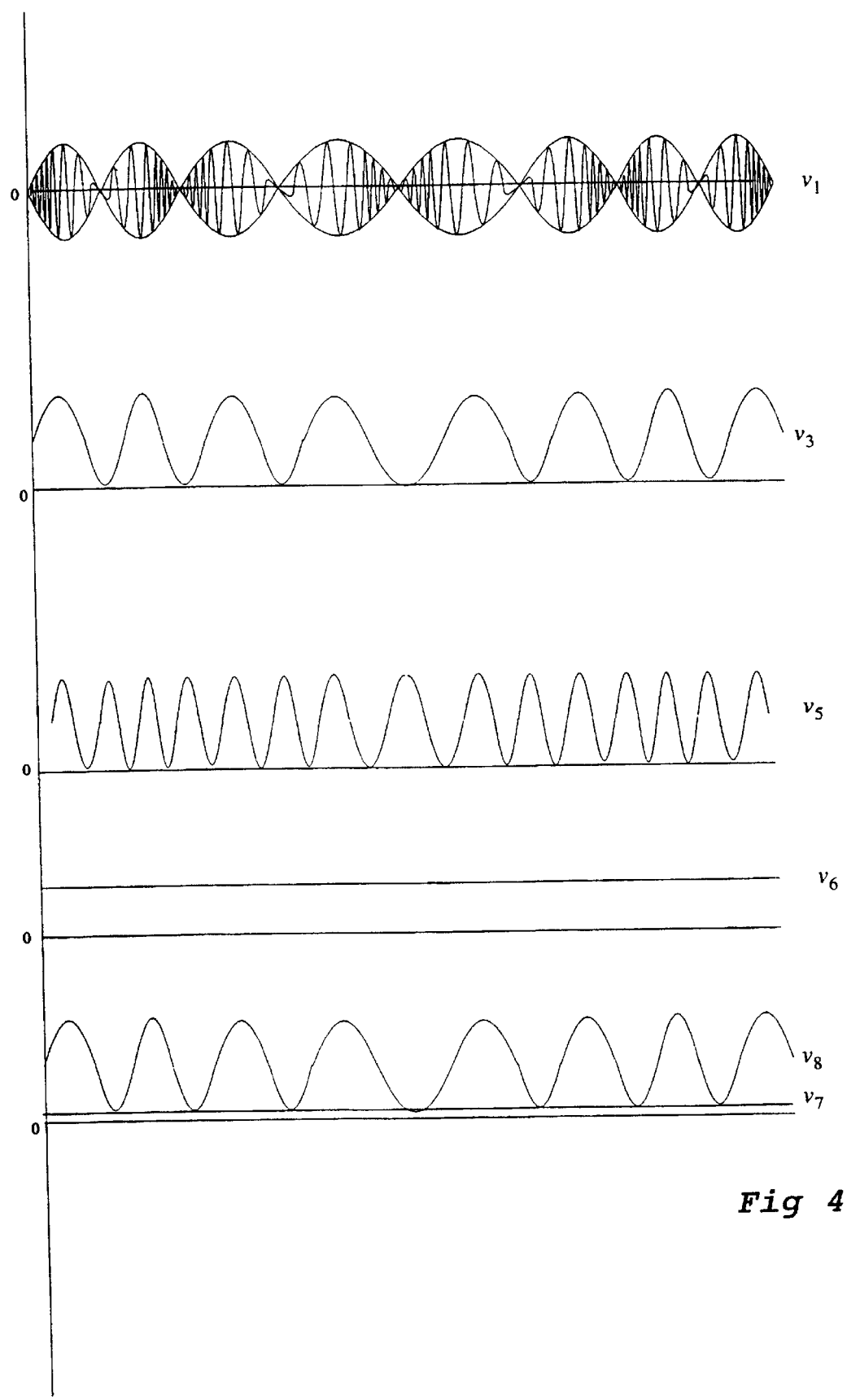
FIG. 4 are waveforms of the different signals of the block diagrams of FIGS. 1 to 3.
Figure 5:
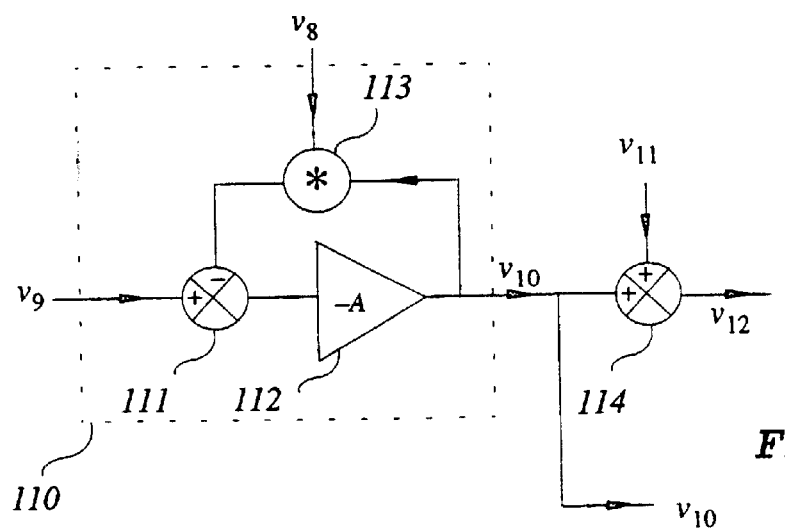
FIG. 5 is a block diagram of the amplitude-locked loop (ALL) circuit for generating the quotient function of the invention.
Figure 6:
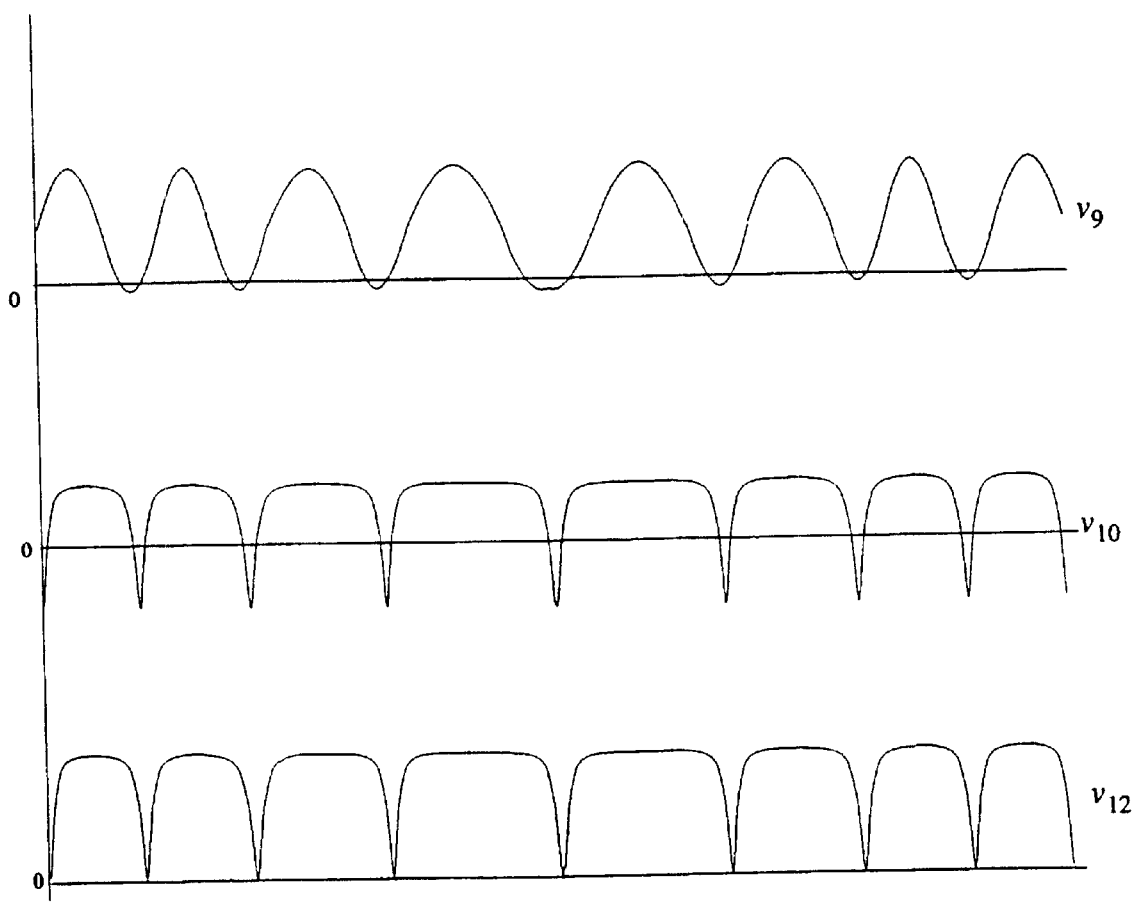
FIG. 6 are waveforms of the signals of the circuit of FIG. 5.
Figure 7:
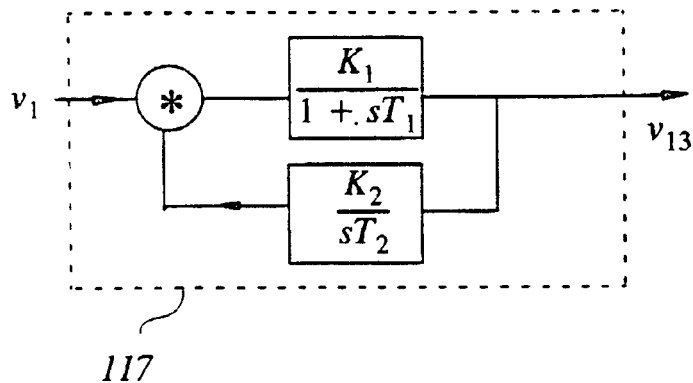
FIG. 7 is a block diagram of a phase-locked loop used in the circuit of the invention.
Figure 8:
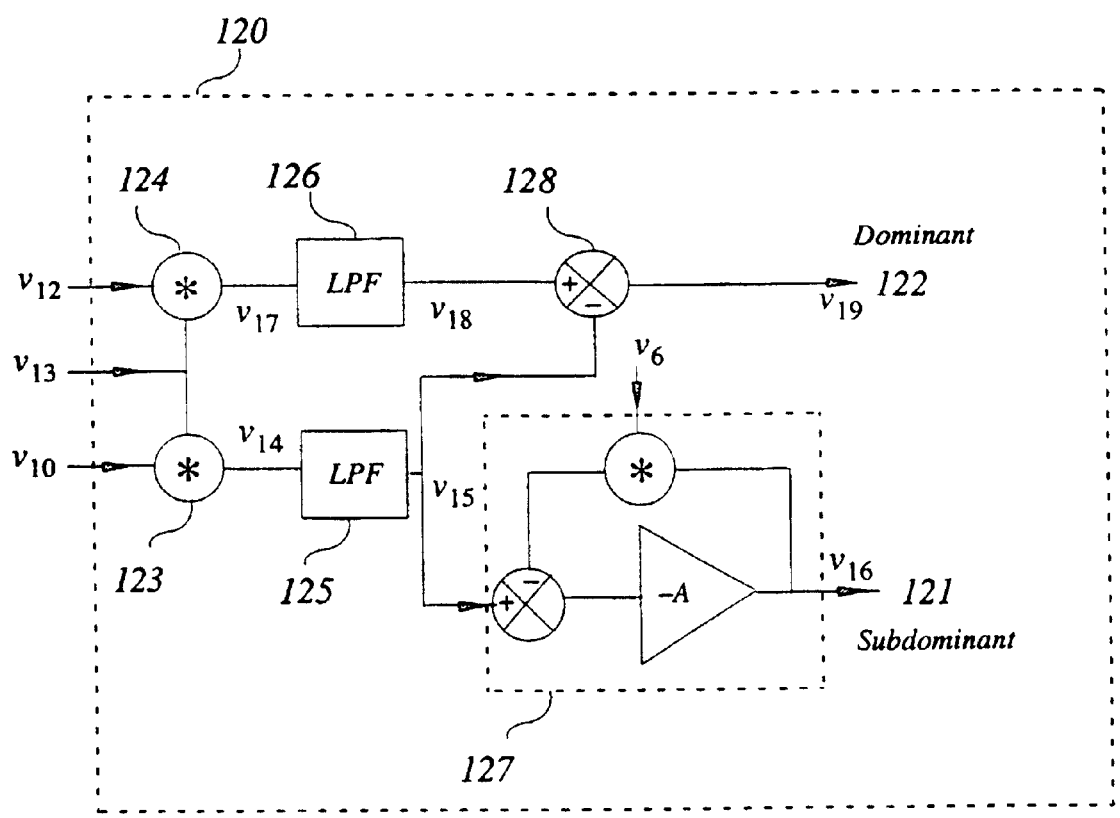
FIG. 8 is a block diagram illustrating the dominant and sub-dominant channels of the circuit of the invention.
Figure 9:
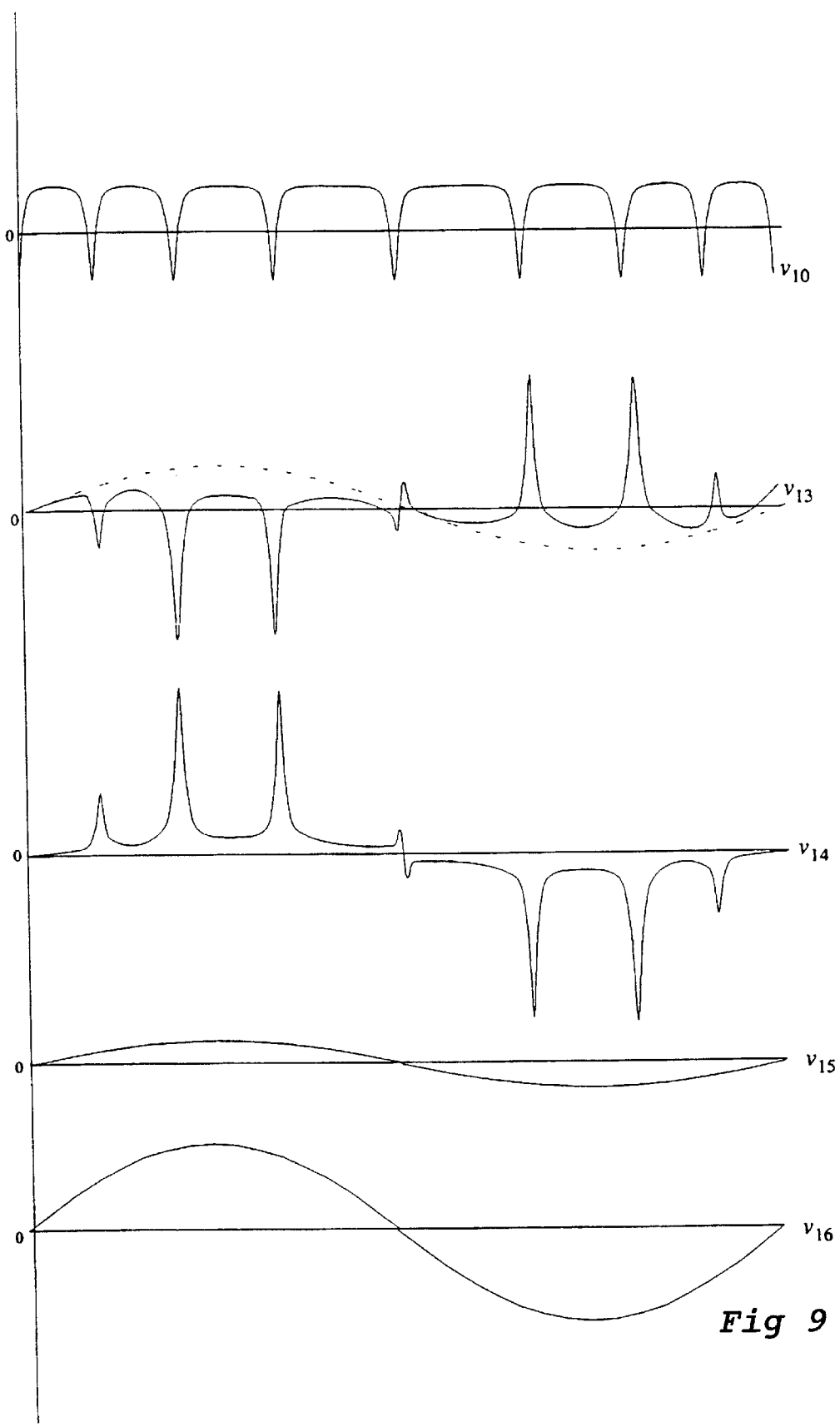
FIGS. 9, 10 and 11 illustrate waveforms of the circuit of FIG. 8.
Figure 10:
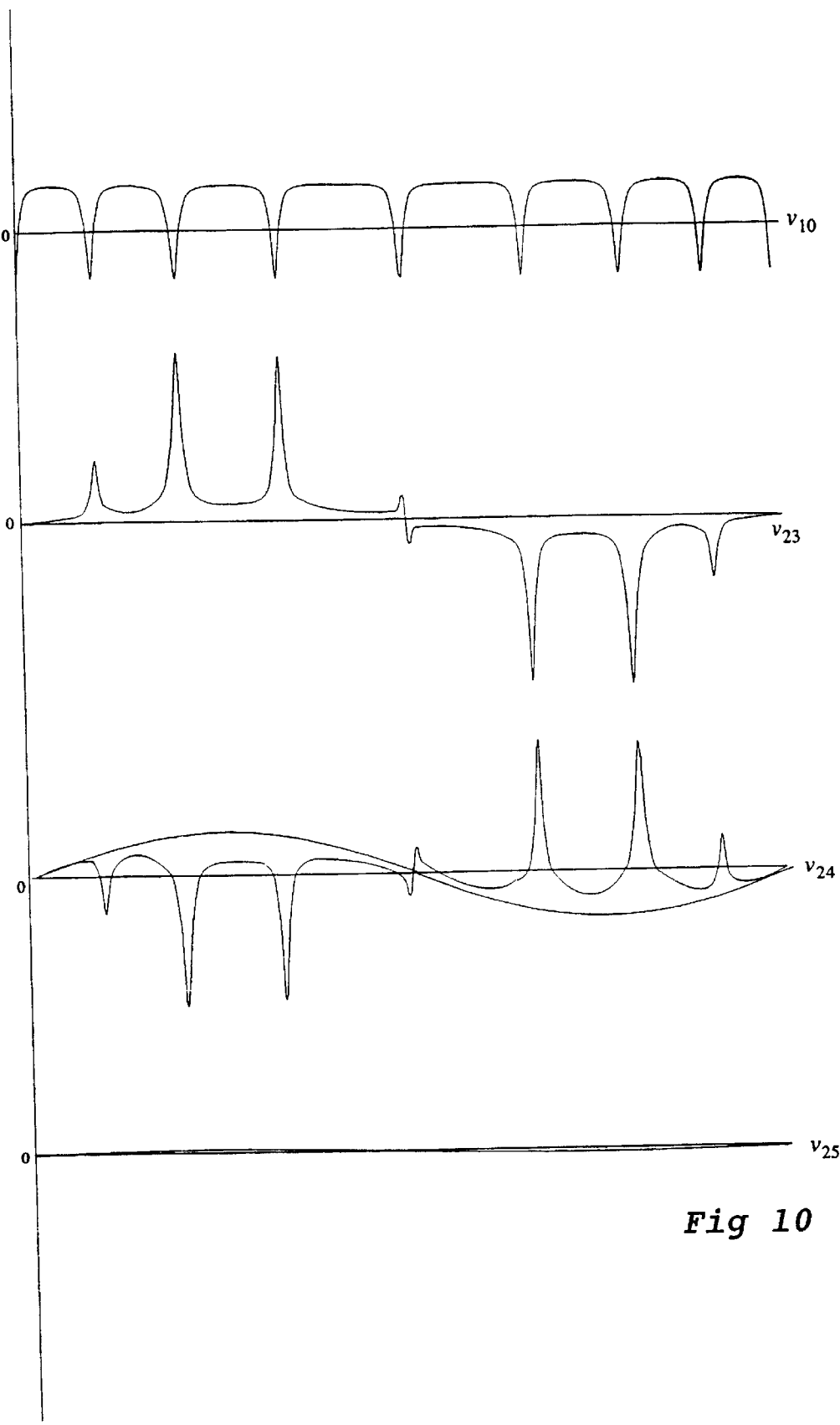
Figure 11:
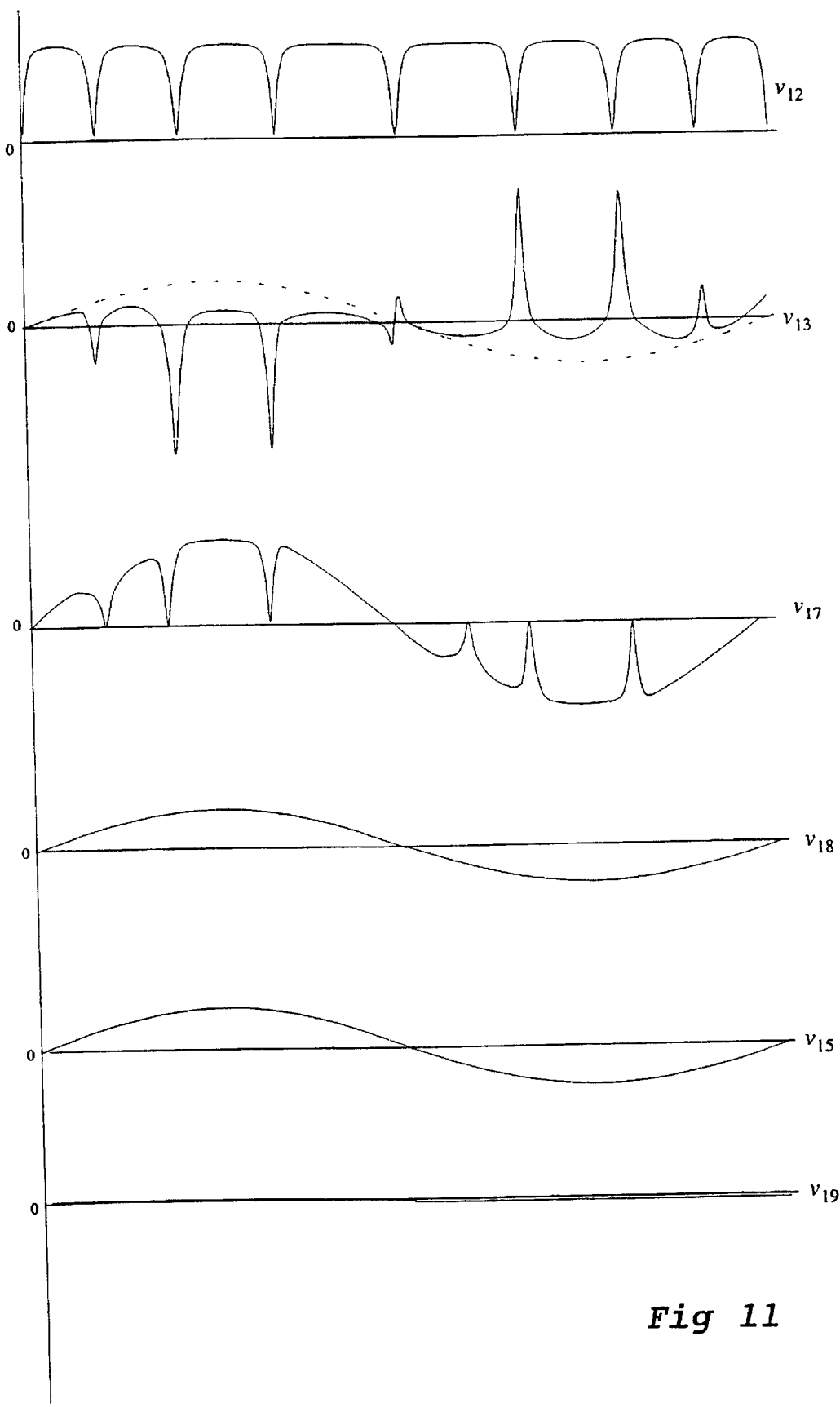

Referring to FIG. 1, a raw received co-channel carrier $v_o$, is passed through a r.f./i.f. stage 101 and through an automatic gain control circuit (AGC) 102 to give v1 which is termed the co-channel carrier.

$$v_o = \sqrt{1+2m\cos\omega_{d+m^2}} \cos(\omega_c t + \beta\omega_m \cos\omega_m t)$$

where m is the ratio of the interfering carrier to the wanted carrier;

$\omega_c$ is the angular frequency of the wanted carrier;

$\omega_m$ is the modulation frequency;

$\omega_d$ is the difference frequency between the wanted carrier and the interfering carrier; and $\beta$ is the depth of modulation.

$$v_1 \text{ is thus } \frac{\sqrt{1+2m\cos\omega_d t + m^2}}{\sqrt{1+m^2}} \cos(\omega_c t + \beta\omega_m \cos\omega_m t)$$

The co-channel carrier $v_1$, is passed to a first pure squaring circuit 103 to give $v_2$ termed the pure squared received co-channel carrier, where $$v_2 = \frac{\sqrt{1+2m\cos\omega_d t + m^2}}{\sqrt{1+m^2}} \cos(\omega_c t + \beta\omega_m \cos\omega_m t)$$

$v_2$ is then passed through a low pass filter 104 to give a filtered squared carrier $v_3$, where

What is claimed is:

1. A method for the demodulation of fm signals, the fm signals comprising a wanted carrier signal and an interfering carrier signal, the method comprising the steps of: generating a first signal ($v_3$), said first signal ($v_3$) being a function of the ratio (m) of the interfering carrier to the wanted carrier and of the instantaneous difference ($\omega_d$) between the frequency of the wanted carrier and the interfering carrier; generating a second signal ($v_4$) from said first signal ($v_3$) by removing any dc value from said first signal ($v_3$); generating the mathematical square ($v_5$) of said second signal ($v_4$); generating a dc value ($v_6$) from said squared signal ($v_5$); generating a numerator function ($v_9$) being a function of said dc value ($v_6$), said second signal ($v_4$) and a dc offset ($v_7$); generating a denominator function ($v_8$) being a function of said first signal ($v_3$) and said dc offset ($v_7$); performing a division process between said numerator function ($v_9$) and said denominator function ($v_8$) to generate a quotient function ($v_{10}$); and using said quotient function ($v_{10}$) to control a demodulator circuit to generate a desired output.

2. A method as claimed in claim 1 wherein said first signal ($v_3$) is generated by squaring an initial signal ($v_1$) to give a squared initial signal ($v_2$), and passing said squared initial signal ($v_2$) through a low pass filter (104).

3. A method as claimed in claim 2 wherein said initial signal ($v_1$) is derived by passing an input co-channel carrier ($v_0$) through an automatic gain control circuit (102).

4. A method as claimed in claim 1 wherein said quotient function ($v_{10}$) is generated by dividing said numerator function ($v_9$) by said denominator function ($v_8$) in an Amplitude Locked Loop circuit (110).

5. A method as claimed in either claim 3 or claim 4 including the step of generating, from said initial signal ($v_1$), a demodulated output signal ($v_{13}$) by passing said initial signal ($v_1$) through a Phase Locked Loop circuit (102).

6. A method as claimed in claim 5 including the step of multiplying said quotient function ($v_{10}$) with said demodulated output signal ($v_3$) to generate a first intermediate output ($v_{14}$).

7. A method as claimed in claim 6, including the step of passing said first intermediate output ($v_{14}$) through a low pass filter (125) to generate a first filtered output ($v_{15}$).

8. A method as claimed in claim 7, including the step of multiplying said first filtered output ($v_{15}$) by said dc value ($v_6$) to give a first desired output ($v_{16}$).

9. A method as claimed in claim 5, including the step of adding a dc voltage ($v_{11}$) to the said quotient function ($v_{10}$) to generate a modified quotient function ($v_{12}$).

10. A method as claimed in claim 9, including the step of multiplying said modified quotient signal ($v_{12}$) by said demodulated output ($v_{13}$) to give a second intermediate output ($v_{17}$).

11. A method as claimed in claim 10, including passing said second intermediate output ($v_{17}$) through a low pass filter (126) to give a second filtered output ($v_{18}$) and subtracting from said second filtered output ($v_{18}$) said first filtered output ($v_{15}$) to give a second desired output ($v_{19}$).

12. A circuit for demodulating FM signals, the FM signals comprising a wanted carrier signal and an interfering carrier signal, the circuit comprising means (102, 103,104) for generating a first signal ($v_3$), said first signal ($v_3$) being a function of the ratio (m) of the interfering carrier to the wanted carrier and of the instantaneous difference ($\omega_d$) between the frequency of the wanted carrier and the interfering carrier; means (105) for generating a second signal ($v_4$) from said first signal ($v_3$) by removing any dc value from said first signal ($v_3$); a squaring circuit (106) for generating the mathematical square ($v_5$) of said second signal ($v_4$); means (107) for generating a dc value ($v_6$) from said squared signal ($v_5$); means (109) for generating a numerator function ($v_9$) being a function of said dc value ($v_6$), said second signal ($v_4$) and a dc offset ($v_7$); means (108) for generating a denominator function ($v_8$) being a function of said first signal ($v_3$) and said dc offset ($v_7$); a division circuit (110) for performing a division process between said numerator function ($v_8$) and said denominator function ($v_6$) to generate a quotient function ($v_{10}$); and a demodulator circuit (120) conditioned by said quotient function ($v_{10}$) to generate a desired output.

13. A circuit as claimed in claim 12, wherein said means for generating said second signal ($v_4$) from said first signal ($v_3$) is a high pass filter (105).

14. A circuit as claimed in claim 12 wherein said means for generating said dc value ($v_6$) is a low pass filter (107).

15. A circuit as claimed in claim 12, wherein said means for generating said numerator function ($v_9$) is an adder circuit (109).

16. A circuit as claimed in claim 12, wherein said means for generating said numerator function ($v_8$) is an adder circuit (108).

17. A circuit as claimed in claim 12, wherein said division circuit (110) is an Amplitude Locked Loop Circuit.

* * * * *